(12) United States Patent
Hirotsuru et al.

(10) Patent No.: US 8,322,398 B2
(45) Date of Patent: *Dec. 4, 2012

(54) MANUFACTURING METHOD OF ALUMINUM-DIAMOND COMPOSITE

(75) Inventors: Hideki Hirotsuru, Omuta (JP); Hideo Tsukamoto, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/054,266

(22) PCT Filed: Jul. 14, 2009

(86) PCT No.: PCT/JP2009/062706
§ 371 (c)(1),
(2), (4) Date: Mar. 28, 2011

(87) PCT Pub. No.: WO2010/007974
PCT Pub. Date: Jan. 21, 2010

(65) Prior Publication Data
US 2011/0198771 A1    Aug. 18, 2011

(30) Foreign Application Priority Data
Jul. 17, 2008    (JP) .................... 2008-186581

(51) Int. Cl.
*B22D 19/14*    (2006.01)
(52) U.S. Cl. .......................... 164/98; 164/97
(58) Field of Classification Search ............. 164/97, 164/98
See application file for complete search history.

(56) References Cited

U.S. PATENT DOCUMENTS

| | | | |
|---|---|---|---|
| 5,451,352 A * | 9/1995 | Cook | 264/102 |
| 5,496,596 A * | 3/1996 | Herb et al. | 427/577 |
| 6,447,894 B1 * | 9/2002 | Hirotsuru et al. | 428/307.7 |
| 6,933,531 B1 | 8/2005 | Ishikawa et al. | |

(Continued)

FOREIGN PATENT DOCUMENTS

JP    9 157773    6/1997

(Continued)

OTHER PUBLICATIONS

International Search Report issued Oct. 6, 2009 in PCT/JP09/62706 filed Jul. 14, 2009.

(Continued)

*Primary Examiner* — Kuang Lin
(74) *Attorney, Agent, or Firm* — Oblon, Spivak, McClelland, Maier & Neustadt, L.L.P.

(57) ABSTRACT

A process for the production of an aluminum-diamond composite, characterized by comprising the step of preparing a diamond powder having a specific diameter, the step of adding a colloidal silica to the diamond powder to form a slurry, the step of subjecting the slurry to press forming or slip casting to produce a compact of the diamond particles, the step of firing the compact either in air or in a nitrogen atmosphere to form a porous diamond preform, the step of heating the porous diamond preform, the step of heating an aluminum alloy to a temperature equal to or above the melting point of the alloy and impregnating the molten alloy into the porous diamond preform to make a flat plate-like aluminum-diamond composite wherein both surfaces are covered with surface layers containing an aluminum-base metal, and the step of working the aluminum-diamond composite into an aluminum-diamond composite.

7 Claims, 2 Drawing Sheets

U.S. PATENT DOCUMENTS

2010/0110637 A1   5/2010   Pickard et al.

FOREIGN PATENT DOCUMENTS

| JP | 2000 303126 | 10/2000 |
| JP | 2001 339022 | 12/2001 |
| JP | 2007 518875 | 7/2007 |
| WO | 2007 080701 | 7/2007 |
| WO | WO 2007/125878 | * 11/2007 |

OTHER PUBLICATIONS

U.S. Appl. No. 13/054,342, filed Jan. 14, 2011, Hirotsuru, et al.

* cited by examiner

[FIG. 1]
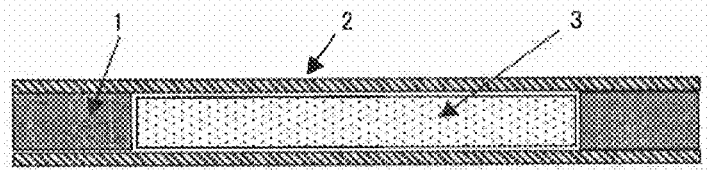
[FIG. 2]
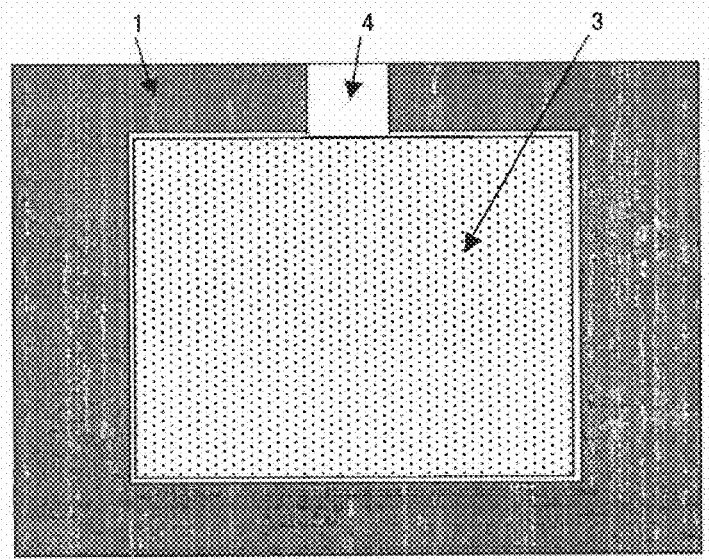
[FIG. 3]
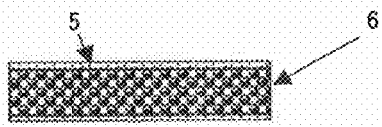
[FIG. 4]
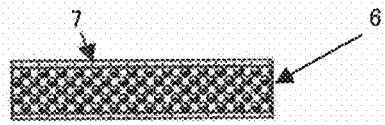
[FIG. 5]
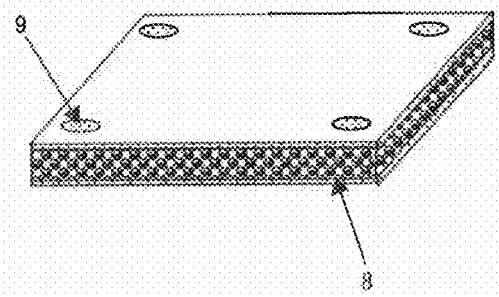

[FIG. 6]
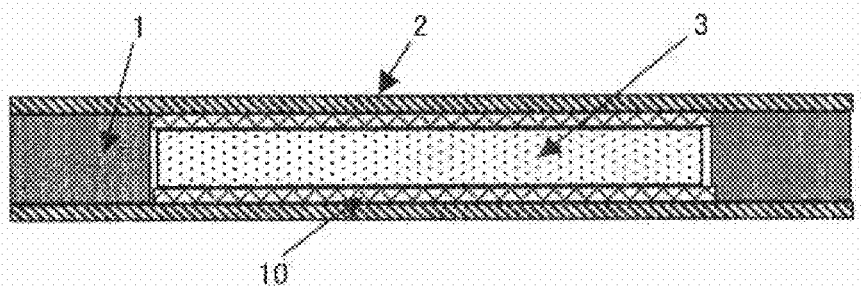

MANUFACTURING METHOD OF ALUMINUM-DIAMOND COMPOSITE

TECHNICAL FIELD

The present invention relates to a process for producing an aluminum-diamond composite.

BACKGROUND ART

Generally, for semiconductor devices such as semiconductor laser devices and high performance MPUs (microprocessing units) used in optical communications or the like, the efficient release of heat generated by the devices is very important for preventing malfunctions. In recent years, advances in semiconductor device technology have resulted in devices with higher power outputs, higher speeds and higher integration, and there have been increasingly strict requirements for heat dissipation. For this reason, a high thermal conductivity is generally required, even for heat dissipation components such as heat sinks, so copper (Cu), which has a high thermal conductivity of 390 W/mK, has been used.

On the other hand, along with higher power outputs, each semiconductor device has become larger in size, and the problem of the mismatch in thermal expansion between the semiconductor device and the heat sink used for heat dissipation has surfaced. In order to address these issues, there has been a demand for the development of heat sink materials that have both a high thermal conductivity and a coefficient of thermal expansion matching with that of semiconductor devices. As such a material, a metal and ceramic composite, for example, an aluminum (Al) and silicon carbide (SiC) composite, has been proposed (Patent Document 1).

However, no matter how conditions are adjusted, the thermal conductivity of an Al—SiC based composite material is at most 300 W/mK, and there has been a demand to develop a heat sink material having a thermal conductivity that is even higher than the thermal conductivity of copper. As such a material, a metal-diamond composite material, in which the high thermal conductivity of diamond and the large coefficient of thermal expansion of metal are combined to achieve high thermal conductivity and coefficient of thermal expansion close to that of semiconductor materials, has been proposed (Patent Document 2).

Additionally, in Patent Document 3, the formation of a β type SiC layer on the surface of diamond grains suppresses the generation of metal carbides having low thermal conductivity formed during compositing and improves the wettability by a molten metal to improve the thermal conductivity of the resulting metal-diamond composite material.

Further, since diamond is a very hard material, the metal-diamond composite material obtained by compositing diamond with a metal is similarly very hard and is a material that is difficult to work. For that reason, most of the metal-diamond composite materials cannot be worked by common diamond tools, and so the problem is how to profile a metal-diamond composite material at a low cost so that the metal-diamond composite material can be used as a heat sink that is small in size and exists in various shapes. With regard to this problem, metal-ceramic composite materials can conduct electricity and so working methods such as electrical discharge cutting have also been investigated.
Patent Document 1: JP-A H9-157773
Patent Document 2: JP-A 2000-303126
Patent Document 3: JP-T 2007-518875

SUMMARY OF THE INVENTION

However, when used as materials for heat sinks as above, heat sinks are generally used by connecting them to the semiconductor devices by soldering or the like, in order to efficiently dissipate the heat generated by the semiconductor device. For this reason, for a heat sink used for this purpose, the surface to be connected by soldering needs to be plated, and in the case of a metal-diamond composite material, the formation of a plating layer is difficult if diamond grains are exposed on the soldering surface. As a result, the thermal resistance of the contact interface is increased. Further, when the soldering surface is rough, the thickness of the solder layer becomes uneven during joining and the heat dissipation is lowered, which is not preferred. For this reason, there are issues regarding platability and reduction of surface roughness, which are required properties of heat sink materials.

As such, a composite material having both a high thermal conductivity and a coefficient of thermal expansion close to that of semiconductor devices as well as improved surface platability and surface roughness is desired.

Specifically, the object of the present invention is to provide a process for producing an aluminum-diamond composite that has both a high thermal conductivity and a coefficient of thermal expansion close to that of semiconductor devices as well as improved surface platability and surface roughness so that it is suitable to be used for heat sinks of semiconductor devices or the like.

Specifically, the process for producing an aluminum-diamond composite according to the present invention comprises a step of preparing a diamond powder composed of diamond grains having a grain size of at least 50 μm at 50% or more by volume of all diamond grains and diamond grains having a grain size of at most 15 μm at 10 to 40% by volume of all diamond grains; a step of adding to said diamond powder a colloidal silica at 0.5 to 3% by mass in terms of solid content with respect to all diamond grains to obtain a slurry; a step of press forming or slip casting said slurry to produce a compact of said diamond grains; and a step of firing said compact at 800° C. to 1100° C. in air or in a nitrogen atmosphere to obtain a porous diamond preform wherein the content of the diamond grains is 40 to 70% by volume of the total volume.

Additionally, it comprises a step of heating said porous diamond preform, a step of heating an aluminum alloy to a temperature equal to or above the melting point of the alloy and impregnating said porous diamond preform with the alloy to produce a plate-shaped aluminum-diamond composite wherein both surfaces are covered by a surface layer comprising a metal mainly composed of aluminum, and a step of working said aluminum-diamond composite into an aluminum-diamond composite.

According to a process for producing an aluminum-diamond composite consisting of the above process, it is possible to obtain an aluminum-diamond composite having a high thermal conductivity and a coefficient of thermal expansion close to that of semiconductor devices as well as improved surface platability and a fine surface roughness.

Additionally, the process for producing an aluminum-diamond composite according to the present invention is characterized in that in the step of heating said porous diamond preform, said porous diamond preform is placed in an iron or graphite frame, with said porous diamond preform being sandwiched from both surfaces by mold release plates coated with a mold release agent, and heated at 600 to 750° C.

Additionally, it is characterized in that in the step of producing a plate-shaped aluminum-diamond composite, an aluminum alloy comprising silicon at 0 to 25% by mass and magnesium at 0.5 to 3% by mass is heated to a temperature equal to or above the melting point of the alloy and said porous diamond preform is impregnated with the alloy at a pressure of at least 20 MPa to produce a plate-shaped aluminum-diamond composite wherein both surfaces are covered by a surface layer containing a metal mainly composed of aluminum.

Additionally, it is characterized in that in the step of working said aluminum-diamond composite, said aluminum-diamond composite is worked into an aluminum-diamond composite by water jet cutting or electrical discharge cutting.

According to the process for producing an aluminum-diamond composite of the present invention, it is possible to obtain an aluminum-diamond composite having a high thermal conductivity and a coefficient of thermal expansion close to that of semiconductor devices as well as an improved surface platability and a fine surface roughness.

BRIEF DESCRIPTION OF THE DRAWINGS

FIG. 1 A cross-sectional view of the structure of an aluminum-diamond composite according to Embodiment 1 before compositing.

FIG. 2 A schematic of the structure of an aluminum-diamond composite according to Embodiment 1 before compositing (viewed from the side of the plate-shaped compact).

FIG. 3 A diagram of the structure of an aluminum-diamond composite according to Embodiment 1.

FIG. 4 A diagram of the structure of an aluminum-diamond composite according to Embodiment 2.

FIG. 5 A perspective view of the structure of an aluminum-diamond composite according to Embodiment 1.

FIG. 6 A cross-sectional view of the structure of an aluminum-diamond composite according to Embodiment 2 before compositing.

DESCRIPTION OF REFERENCE NUMBERS

1  Frame
2  Mold release plate
3  Preform
4  Sprue
5  Surface layer
6  Aluminum-diamond composite
7  Surface layer consisting of an aluminum-ceramic composite material
8  Side Surface Portion
9  Hole Portion
10 Ceramic paper

MODES FOR CARRYING OUT THE INVENTION

[Explanation of Terminology]

In the present specification, "to" shall be inclusive on both ends. For example, "A to B" shall mean at least A and at most B.

In the present specification, "both surfaces" shall refer to the top and bottom surfaces of an aluminum-diamond composite in the shape of a plate. Additionally, in the present specification, "side surface portion" shall refer to a side surface that is approximately perpendicular to the above surfaces of the aluminum-diamond composite in the shape of a plate.

Additionally, in the present specification, "hole portion" shall refer to a through-hole passing through the top and bottom surfaces of the plate-shaped aluminum-diamond composite, provided for screwing a component made of the present invention to another heat dissipation element.

Herebelow, embodiments of the process for producing an aluminum-diamond composite according to the present invention shall be explained using the drawings.

The process for producing an aluminum-diamond composite according to the present embodiment comprises a step of preparing a diamond powder composed of diamond grains having a grain size of at least 50 μm at 50% or more by volume of all diamond grains and diamond grains having a grain size of at most 15 μm at 10 to 40% by volume of all diamond grains; a step of adding to said diamond powder a colloidal silica at 0.5 to 3% by mass in terms of solid content with respect to all diamond grains to obtain a slurry; a step of press forming or slip casting said slurry to produce a compact of said diamond grains; and a step of firing said compact at 800° C. to 1100° C. in air or in a nitrogen atmosphere to obtain a porous diamond preform wherein the content of the diamond grains is 40 to 70% by volume of the total volume.

Moreover, it comprises a step of heating said porous diamond preform, a step of heating an aluminum alloy to a temperature equal to or above the melting point of the alloy and impregnating said porous diamond preform with the alloy to produce a plate-shaped aluminum-diamond composite wherein both surfaces are covered by a surface layer comprising a metal mainly composed of aluminum, and a step of working said aluminum-diamond composite into an aluminum-diamond composite.

Additionally, the process for producing an aluminum-diamond composite according to the present embodiment is characterized in that in the step of heating said porous diamond preform, said porous diamond preform is placed in an iron or graphite frame, with said porous diamond preform being sandwiched from both surfaces by mold release plates coated with a mold release agent, and heated at 600 to 750° C.

Additionally, it is characterized in that in the step of producing a plate-shaped aluminum-diamond composite, an aluminum alloy comprising silicon at 0 to 25% by mass and magnesium at 0.5 to 3% by mass is heated to a temperature equal to or above the melting point of the alloy and said porous diamond preform is impregnated with the alloy at a pressure of at least 20 MPa to produce a plate-shaped aluminum-diamond composite wherein both surfaces are covered by a surface layer containing a metal mainly composed of aluminum. Additionally, it is characterized in that in the step of working said aluminum-diamond composite, said aluminum-diamond composite is worked into an aluminum-diamond composite by water jet cutting or electrical discharge cutting.

According to a process for producing an aluminum-diamond composite consisting of the above process, it is possible to obtain an aluminum-diamond composite having a high thermal conductivity and a coefficient of thermal expansion close to that of semiconductor devices as well as an improved surface platability and a fine surface roughness.

Herebelow, a process for producing the aluminum-diamond composite according to the present embodiment by liquid metal forging shall be explained. However, the aluminum-diamond composite according to the present invention is not limited to only those produced by liquid metal forging.

Here, methods for producing aluminum-diamond composites can be roughly divided into two categories: impregnation and powder metallurgy. When considering properties such as thermal conductivity etc., those among them that have been actually commercialized are mostly produced by impregnation. There are various manufacturing processes in impregnation; there are processes performed at ambient pressure and high-pressure forging processes performed under a high pressure. High-pressure forging processes include liquid metal forging and die casting. The favorable process for the present invention is a high-pressure forging process in which impregnation is performed under a high pressure, and for obtaining a fine composite that is superior in properties such as thermal conductivity, liquid metal forging is preferred. Liquid metal forging is generally a process in which a powder or a compact of diamond etc. is loaded into a high-pressure vessel and impregnated with a molten metal such as an aluminum alloy under a high temperature and a high pressure to produce a composite material.

[Diamond Powder]

For the diamond powder, which is the basic ingredient, a natural diamond powder or an artificial diamond powder may be used. The content of the diamond grains in the porous diamond preform according to the present embodiment is preferably at least 40% by volume and at most 70% by volume. The content of the diamond grains in the porous diamond preform corresponds to the content of the diamond grains in the aluminum-diamond composite obtained by compositing and affects the properties of the aluminum-diamond composite.

When the content of the diamond grains in the porous diamond preform is at least 40% by volume, a sufficient thermal conductivity can be achieved for the aluminum-diamond composite for which the porous diamond preform is used. Additionally, when considering the moldability, it is preferred that the content of the diamond grains be at most 70% by volume. When it is at most 70% by volume, the diamond grains do not need to be worked into a spherical shape or the like, and an aluminum-diamond composite can be obtained at a stable cost.

Regarding the granularity of the above diamond powder, as it relates to the production of the porous diamond preform, it is preferred that among all diamond grains, grains having a grain size of at least 50 μm are at least 50% by volume and grains having a grain size of at most 15 μm are 10 to 40% by volume.

When among all diamond grains, grains having a grain size of at least 50 μm are at least 50% by volume, a sufficient thermal conductivity can be achieved for the aluminum-diamond composite obtained by compositing the above porous diamond preform.

Additionally, when among all diamond grains, grains having a grain size of at most 15 μm are at least 10% by volume, a sufficient strength can be achieved for the resulting porous diamond preform, allowing a porous diamond preform suitable for subsequent handling and working to be made.

Further, when among all diamond grains, grains having a grain size of at most 15 μm are at most 40% by volume, a sufficient thermal conductivity can be achieved for the aluminum-diamond composite obtained by compositing the above porous diamond preform. In other words, by using a diamond powder of the above granularity as the basic ingredient, the resulting porous diamond preform can exhibit a strength that can be useful in subsequent handling and working.

Additionally, by using a diamond powder in which a layer of β type silicon carbide is formed on the surface of the above diamond grains, the generation of metal carbides ($Al_4C_3$) having a low thermal conductivity formed during compositing can be suppressed, and the wettability by a molten aluminum can be improved. As a result, it is possible to achieve an effect of improved thermal conductivity of the resulting aluminum-diamond composite.

Additionally, in the present embodiment, it is preferred that a colloidal silica be added to the diamond powder during its formation as an inorganic binder at 0.5 to 3% by mass in terms of solid content with respect to all diamond grains to form a slurry, which is then made into a compact by press forming or slip casting.

Since the above colloidal silica forms amorphous or crystalline silica in the subsequent firing step and binds to the diamond grains, it is favorable for achieving strength in the porous diamond preform. Additionally, since the above colloidal silica reacts with the aluminum alloy during subsequent compositing by liquid metal forging, it can be removed from the surface of the diamond grains and is also preferred when considering thermal conductivity of the aluminum-diamond composite.

When the added amount of the above colloidal silica is at least 0.5% by mass in terms of solid content with respect to the diamond grains, a sufficient strength can be achieved for the resulting porous diamond preform, allowing a porous diamond preform suitable for subsequent handling and working to be made. Additionally, when the added amount of the colloidal silica is at most 3% by mass in terms of solid content with respect to the diamond grains, the colloidal silica can be sufficiently removed from the surface of the diamond grains due to its reaction with the aluminum alloy during subsequent compositing by liquid metal forging, and a sufficient thermal conductivity can be achieved for the resulting aluminum-diamond composite.

[Molding Method]

The method for molding the above slurry of diamond grains is preferably press forming or slip casting. In the molding method, excess moisture is preferably removed during the molding of the slurry. When press forming, the molding pressure is preferably at a level of 2-100 MPa. When the molding pressure is 2 to 100 MPa, it is possible to obtain a compact with a uniformly high density, which is preferred. Additionally, it is possible to employ a filter press, which allows water removal and molding to be performed simultaneously. Additionally, when slip casting, it is also possible to employ pressure slip casting in which the slurry is pressurized and casted. Pressure slip casting is preferred as a high-density compact can be obtained by using pressure slip casting.

[Firing]

The compact obtained by the above steps is dried, then fired at a temperature of 800° C. to 1100° C. in air or in a nitrogen atmosphere to produce a porous diamond preform. Regarding the firing atmosphere, when considering the cost, it is preferred that firing be performed in air or in a nitrogen atmosphere, however, there would not be any problem with the properties even if it were performed in an inert gas atmosphere such as argon.

When the firing temperature is at least 800° C., a sufficient bonding strength can be achieved for the added colloidal silica, and therefore the strength of the resulting porous diamond preform is increased, allowing a porous diamond preform suitable for subsequent handling and working to be made. On the other hand, when the firing temperature is at most 1100° C., oxidization of the diamond grains can be suppressed. The firing time depends on the size of the compact, but it is preferably in the range of 30 minutes to 2 hours. This range of time is preferred as a porous diamond preform suitable for handling and working can be obtained when it is within this range of time.

[Compact Working]

The porous diamond preform obtained by the above steps (referred to as "preform" hereafter) is worked to a predetermined plate thickness by cutting and grinding as necessary. There is no particular limitation to the working method; cutting using a bandsaw or cutter or grinding using a grinder etc. can be carried out to adjust the plate thickness and shape.

For example, when the above preform is not of a desired shape, the above working is preferred as it allows a desired shape to be obtained. Additionally, by making the above preform thicker than the desired thickness and larger than the desired dimensions, then carrying out the above working, it is possible to simultaneously obtain multiple worked preforms of a stable quality at a low cost.

In the present embodiment, a surface layer of a uniformly predetermined thickness mainly composed of aluminum is formed on surfaces of the aluminum-diamond composite. For that reason, it is preferred that the preform be formed such that differences in the in-plane thickness are at most 100 μm, preferably at most 30 μm, or surface finishing can be carried out after forming the above preform. When the differences in the in-plane thickness of the preform are at most 100 μm, differences in the thickness of the surface layers on the surfaces of the resulting aluminum-diamond composite are small, and therefore it is preferred that the differences in the in-plane thickness of the preform be at most 100 μm.

Next, the preform worked to a predetermined plate thickness (reference number 3 in FIG. 1) is placed inside an iron or graphite frame (reference number 1 in FIG. 1) as shown in FIG. 1, making a structure sandwiched from both surfaces by mold release plates (reference number 2 in FIG. 1) coated with a mold release agent, and multiple such structures are stacked to form a block. The method for producing this block may include a method in which iron plates are placed on both sides of the structures, connected by bolts and clamped by a predetermined clamping torque to produce a block.

[Frame]

For the above frame 1 used in the present embodiment, as long as the shape, particularly the plate thickness, is not changed during compositing by liquid metal forging, anything, including steel, stainless steel and graphite, may be used. Regarding material properties, as long as the material does not react with aluminum alloys and change its shape or get damaged by the clamping torque during block production, anything, including ceramics and other metals, may also be used.

Further, since the aluminum-diamond composite is to be demolded from the above frame 1 after compositing, frame 1 is preferably used with its surfaces coated with a graphite or alumina based mold release agent. Additionally, it is preferred that a sprue (reference number 4 in FIG. 2) be provided in the frame 1 so as to allow the entry of the aluminum alloy during compositing by liquid metal forging. There is no limitation to the shape of sprue 4, which may be provided at only one location, as shown in FIG. 2, or at multiple locations of the above frame 1. The provision of such a sprue 4 allows the molten alloy to be supplied steadily.

Additionally, in the present embodiment, since frame 1 is used to form the structure during compositing by liquid metal forging, it is possible to control the thickness of the resulting aluminum-diamond composite by adjusting the thickness of frame 1. Additionally, since frame 1 supports the tightening stress during stacking and the stress applied to the preform during compositing by liquid metal forging, the use of frame 1 may also provide an effect of reducing cracking of the preform during compositing. For this reason, the thickness of frame 1, when directly stacking the preforms, is preferably 0.05 mm to 0.1 mm thicker than the thickness of the preform.

When the thickness of frame 1 is at least 0.05 mm thicker than the thickness of preform 3, the preform is not damaged by the tightening during stacking etc., and a sufficient thickness of the surface layers mainly composed of aluminum on the surfaces of the resulting aluminum-diamond composite can be ensured.

Additionally, while a piece of ceramic paper may be provided as a layer between preform 3 and mold release plate 2, in this instance, the thickness of the frame is preferably ±0.1 mm relative to the total thickness of preform 3 and the piece of ceramic paper. When the thickness is as described above, the preform is not damaged by the tightening during stacking etc., and a sufficient thickness of the surface layers mainly composed of aluminum on the surfaces of the obtained aluminum-diamond composite can be ensured.

[Mold Release Plate]

Additionally, as mold release plate 2 provided on both surfaces and coated with a mold release agent, a stainless steel plate or ceramic plate may be used without any particular limitation as long as it is a dense body that will not be impregnated with the aluminum alloy during liquid metal forging. Additionally, for the mold release agent coated on mold release plate 2, a mold release agent of graphite, boron nitride or alumina etc. may be used. Further, it is possible to obtain a mold release plate that allows demolding more steadily by coating the above mold release agent after coating alumina-sol etc. on the surface of the mold release plate.

The present embodiment is characterized in that mold release plates 2 provided on both surfaces are stripped off after compositing. Due to this characteristic feature, it is possible to obtain an aluminum-diamond composite having very smooth surfaces.

[Aluminum Alloy]

The aluminum alloy used to produce the aluminum-diamond composite according to the present embodiment is preferably an aluminum alloy containing silicon at 0 to 25% by mass and magnesium at 0.5 to 3% by mass.

In order to allow the aluminum alloy used in the present embodiment to adequately saturate the space in preform 3 during impregnation, the melting point is preferably as low as possible. Such aluminum alloys include aluminum alloys containing silicon and magnesium.

The silicon content is preferably at most 25% by mass; when the silicon content is at most 25% by mass, the melting point of the aluminum alloy can be lowered.

Additionally, it is preferred that magnesium be contained as it strengthens the bond between diamond grains and the metal portion. Further, magnesium reacts with the silica component used during the production of the preform and so the inclusion of magnesium allows the silica on the surface of the diamond grains to be removed. Additionally, the above effect can be sufficiently achieved when the magnesium content is at least 0.5% by mass. Additionally, when the magnesium content is at most 3% by mass, during compositing with the aluminum alloy, the generation of aluminum carbide ($Al_4C_3$) on the surface of the diamond powder can be suppressed and an aluminum-diamond composite having a sufficient thermal conductivity can be obtained.

Regarding metal components other than aluminum, silicon and magnesium in the aluminum alloy, there is no particular limitation as long as they are within a range that does not cause extreme changes in the properties, for example, copper may be included.

After heating the above blocks at 600 to 750° C., one or two or more of the above blocks are placed in a high-pressure vessel, to which a molten aluminum alloy of the above heated to a temperature equal to or above the melting point of the above aluminum alloy is supplied and compressed at a pressure of at least 20 MPa as rapidly as possible so as to prevent lowering of the temperature of the blocks.

The above operation allows the aluminum alloy to saturate the space inside preform 3, thereby allowing a plate-shaped aluminum-diamond composite in which both surfaces are covered by a surface layer containing a metal mainly composed of aluminum to be obtained.

Here, when the heating temperature of the block is at least 600° C., the aluminum alloy can be stably composited and an aluminum-diamond composite having a sufficient thermal conductivity can be obtained. Additionally, when the heating temperature is at most 750° C., during compositing with the aluminum alloy, the generation of aluminum carbide ($Al_4C_3$) on the surface of the diamond powder can be suppressed and an aluminum-diamond composite having a sufficient thermal conductivity can be obtained.

Additionally, regarding the pressure during impregnation, when it is at least 20 MPa, the aluminum alloy can be stably composited, and an aluminum-diamond composite having a sufficient thermal conductivity can be obtained. It is further preferred that the impregnation pressure be at least 50 MPa. When it is at least 50 MPa, an aluminum-diamond composite having more stable thermal conductivity properties can be obtained.

[Surface Layer]

The aluminum-diamond composite according to the present embodiment has a structure in which both surfaces are covered by a surface layer containing a metal mainly composed of aluminum (reference number 5 in FIG. 3) or a surface layer consisting of an aluminum-ceramic composite material (reference number 7 in FIG. 4). For this reason, surface accuracy (surface roughness: Ra) can be adjusted by working (grinding) the surface layer 5 or surface layer 7 consisting of an aluminum-ceramic composite material. Working methods employed in regular metal working can be employed to work the surface layer. For example, a surface roughness: Ra of at most 1 µm may be obtained by grinding using a buff grinder.

Additionally, the average thickness of the surface layer 5 or surface layer 7 consisting of an aluminum-ceramic composite material is 0.03 to 0.3 mm.

Regarding the thickness of the surface layer 5 or surface layer 7 consisting of an aluminum-ceramic composite material, it can be adjusted by providing ceramic paper between the diamond powder and the dense mold release plate coated with a mold release agent during stacking before the previously-described impregnation and compositing the aluminum alloy. When the average thickness of surface layer 5 or surface layer 7 consisting of an aluminum-ceramic composite material is at least 0.03 mm, the diamond grains are not exposed in subsequent treatments, and it is easier to obtain the target surface accuracy and platability. Additionally, when the average thickness of surface layer 5 or surface layer 7 consisting of an aluminum-ceramic composite material is at most 0.3 mm, a sufficient thickness can be obtained for the composite material portion in the resulting aluminum-diamond composite material, and a sufficient thermal conductivity can be ensured.

Additionally, the total of the average thicknesses of surface layers 5 or surface layers 7 consisting of an aluminum-ceramic composite material on both surfaces is preferably at most 20%, and further preferably at most 10%, of the thickness of aluminum-diamond composite 1. When the total of the average thicknesses of the surface layers on both surfaces is at most 20% of the thickness of the material, a sufficient thermal conductivity, in addition to surface accuracy and platability, can be obtained.

[Anneal]

In addition, an anneal treatment may be performed on the aluminum-diamond composite obtained by the above operation. Anneal treatments can remove strain in the above aluminum-diamond composite, resulting in an aluminum-diamond composite with more stable thermal conductivity properties.

To remove only the strain in the composite material without affecting the surface of the resulting aluminum-diamond composite, the above anneal treatment is preferably performed under a condition where the temperature is 400° C. to 550° C. for at least 10 minutes.

[Working of Surface Layer]

When using the aluminum-diamond composite of the present invention as a heat dissipation component, such as a heat sink, the surfaces are preferably smooth with fine surface roughness, the surface roughness: Ra being preferably at most 1 µm and more preferably at most 0.5 µm in consideration of the thermal resistance at the soldering surface.

By making the surface roughness at most 1 µm, a uniform thickness of the solder layer between the semiconductor device and the heat sink can be achieved, and a higher heat dissipation property can be obtained.

Additionally, the planarity of the above surface layer 5 or aluminum-ceramic composite material 8 is preferably at most 30 µM and more preferably at most 10 µm for a size of 50 mm×50 mm. By making the planarity at most 30 µm, a uniform thickness of the solder layer can be achieved, and a higher heat dissipation property can be obtained.

[Working Method]

Next, an example of the method for working the aluminum-diamond composite according to the present embodiment shall be explained. While this aluminum-diamond composite is a very hard material that is difficult to work, a water jet machine can be used to work the outer perimeter portion (side surface portion) (reference number 8 in FIG. 5) and hole portion (reference number 9 in FIG. 5), working the material into a product form. As a result, the resulting aluminum-diamond composite has a structure as shown in FIG. 5 in which the aluminum-diamond composite portion is exposed at outer perimeter portions 8 and hole portions 9.

Here, the above hole portion 9 only needs to be provided such that it passes through the upper and lower surfaces, as shown in FIG. 5, so that the compact can be screwed to another heat dissipation component. For example, by working it into a U shape connected to the outer perimeter portion, working costs may also be reduced.

Additionally, since the aluminum-diamond composite according to the present embodiment is of an electrically conductive material, the outer perimeter portions and hole portions can be worked using an electrical discharge machine. The resulting aluminum-diamond composite is a structure where the aluminum-diamond composite portion is exposed at the outer perimeter portions and hole portions.

Additionally, while it is possible to work the aluminum-diamond composite according to the present embodiment using common diamond tools etc., since it is a very hard material that is difficult to work, when considering the durability of the tools and working costs, processing by a water jet machine or electrical discharge machine is preferred.

[Plating Process]

When using the aluminum-diamond composite according to the present embodiment as a heat sink of a semiconductor device, it is often connected to the semiconductor device by soldering. As such, the soldering surface of the aluminum-diamond composite may be plated.

The plating process is not particularly limited and either non-electrolytic plating or electroplating may be performed. When performing the plating process on aluminum, Ni plating or, when considering the solder wettability, duplex plating of Ni and Au may be carried out. In that case, the thickness of the plating is preferably at least 0.5 and at most 10 µm. When the thickness of the plating is at least 0.5 µm, the occurrence of plating pinholes or solder voids (spaces) can be prevented, and the heat dissipation from the semiconductor device can be ensured. Additionally, when the thickness of the plating is at most 10 µm, it is not affected by the Ni plated coating with a low thermal conductivity, and so the heat dissipation from the semiconductor device can be ensured. Regarding the purity of the Ni plated coating, there is no particular restriction as long as it does not hinder the solder wettability, and it may contain phosphorus or boron etc.

Additionally, the aluminum-diamond composite according to the present embodiment preferably has a thermal conductivity of at least 350 W/mK when the temperature of the aluminum-diamond composite is 25° C. and a coefficient of thermal expansion of 5 to $10 \times 10^{-6}$/K from 25° C. to 150° C.

When the thermal conductivity is at least 350 W/mK at 25° C. and the coefficient of thermal expansion is 5 to $10 \times 10^{-6}$/K from 25° C. to 150° C., a high thermal conductivity and a low coefficient of thermal expansion at the same level as that of the semiconductor device are achieved. For that reason, when used as a heat dissipation component such as a heat sink, the heat dissipation property is superior, the difference in the coefficient of thermal expansion between the semiconductor device and the heat dissipation component is small even when affected by a change in the temperature, and damage to the semiconductor device can be suppressed. As a result, it may be used favorably as a highly reliable heat dissipation component.

Additionally, in the present embodiment, after placing a piece of ceramic paper (reference number 10 in FIG. 6) with a thickness of 0.05 to 0.5 mm and a ceramic fiber content (Vf) of at most 30% by volume between the preform (reference number 3 in FIG. 6) and the mold release plates (reference number 2 in FIG. 6) coated with a mold release agent placed on both surfaces to form a structure, multiple pieces may be further layered to form a block.

By placing ceramic paper 10 between preform 3 and mold release plates 2 coated with a mold release agent placed on both surfaces and compositing with the aluminum alloy, surface layers (reference number 7 in FIG. 4) consisting of an aluminum-ceramic composite material can be formed on both surfaces of the resulting aluminum-diamond composite.

[Aluminum-Ceramic Composite Material]

It is preferred that the content of substances other than the aluminum alloy in the above surface layers 7 consisting of an aluminum-ceramic composite material is at most 30% by volume due to the relationship between platability and surface accuracy. When the content of substances other than the aluminum alloy is at most 30% by volume, an effect of easily workable surface layers can be obtained.

Additionally, for the types of ceramics that can be used as the above ceramic paper 10, ceramic fibers such as alumina fiber, silica fiber and mullite fiber may be used. Moreover, when considering the properties of the above surface layers 7 consisting of an aluminum-ceramic composite material, the ceramic content (Vf) is preferably at most 30% by volume and the ceramic content (Vf) is preferably at most 30% by volume when stacked and compressed.

Additionally, the thickness of the above ceramic fiber is preferably at most 0.5 mm. When it is at most 0.5 mm, the above surface layers can be made into a suitable thickness and an aluminum-diamond composite having a sufficient thermal conductivity can be obtained.

[Effects]

Herebelow, the effects of the aluminum-diamond composite according to the above embodiment shall be explained.

The process for producing an aluminum-diamond composite according to the above embodiment comprises a step of preparing a diamond powder composed of diamond grains having a grain size of at least 50 µm at 50% or more by volume of all diamond grains and diamond grains having a grain size of at most 15 µm at 10 to 40% by volume of all diamond grains; a step of adding to said diamond powder a colloidal silica at 0.5 to 3% by mass in terms of solid content with respect to all diamond grains to obtain a slurry; a step of press forming or slip casting said slurry to produce a compact of said diamond grains; and a step of firing said compact at 800° C. to 1100° C. in air or in a nitrogen atmosphere to obtain a porous diamond preform wherein the content of the diamond grains is 40 to 70% by volume of the total volume.

Additionally, it comprises a step of heating said porous diamond preform; a step of heating an aluminum alloy to a temperature equal to or above the melting point of the alloy and impregnating said porous diamond preform with the alloy to produce a plate-shaped aluminum-diamond composite wherein both surfaces are covered by a surface layer comprising a metal mainly composed of aluminum; and a step of working said aluminum-diamond composite into an aluminum-diamond composite.

According to a process for producing an aluminum-diamond composite consisting of the above process, an aluminum-diamond composite having a high thermal conductivity and a coefficient of thermal expansion close to that of semiconductor devices as well as an improved platability of the surfaces and a fine surface roughness can be obtained.

Additionally, the process for producing an aluminum-diamond composite according to the above embodiment is characterized in that in the step of heating said porous diamond preform, said porous diamond preform is placed in an iron or graphite frame, with said porous diamond preform being sandwiched from both surfaces by mold release plates coated with a mold release agent, and heated at 600 to 750° C. Additionally, in the step of producing a plate-shaped aluminum-diamond composite, an aluminum alloy comprising silicon at 0 to 25% by mass and magnesium at 0.5 to 3% by mass is heated to a temperature equal to or above the melting point of the alloy and said porous diamond preform is impregnated with the alloy at a pressure of at least 20 MPa to produce a plate-shaped aluminum-diamond composite wherein both surfaces are covered by a surface layer comprising a metal mainly composed of aluminum. Additionally, in the step of working said aluminum-diamond composite, said aluminum-diamond composite is worked into an aluminum-diamond composite by water jet cutting or electrical discharge cutting.

According to a process for producing an aluminum-diamond composite consisting of the above process, an aluminum-diamond composite having a high thermal conductivity and a coefficient of thermal expansion close to that of semiconductor devices as well as an improved platability of the surfaces and a fine surface roughness can be obtained.

Additionally, it is characterized in that in the step of heating said porous diamond preform, a piece of ceramic paper with a thickness of 0.05 to 0.5 mm is provided on both surfaces of said porous diamond preform and said porous diamond preform is further sandwiched by said mold release plates.

By doing so, it is possible to produce an aluminum-diamond composite 6 having surface layers consisting of an aluminum-ceramic composite material of a desired thickness at a low cost.

Additionally, it further comprises a step of working said porous diamond preform before the step of heating said porous diamond preform.

By doing so, it becomes a production process that allows multiple porous diamond preforms of a stable quality to be obtained simultaneously at a lower cost.

Additionally, a side surface portion and a hole portion may be formed during the step of said water jet cutting or electrical discharge cutting. By doing so, when it is used as a heat dissipation component, it can be fixed by a screw or the like.

While the process for producing an aluminum-diamond composite according to the present invention has been explained with the embodiments above, the present invention is not limited to them.

EXAMPLES

Herebelow, the present invention shall be explained in further detail with examples and comparative examples; however, the present invention is not limited thereto.

Examples 1 to 11 and Comparative Examples 1 to 6

Commercially available high-purity diamond powder A (average grain size: 150 μm), high-purity diamond powder B (average grain size: 50 μm), high-purity diamond powder C (average grain size: 30 μm), high-purity diamond powder D (average grain size: 15 μm), high-purity diamond powder E (average grain size: 10 μm) and high-purity diamond powder F (average grain size: 1 μm) were mixed at compounding ratios shown in Table 1. Additionally, after adding silica sol (manufactured by Nissan Chemical Industries, Ltd.: SNOWTEX) with a solid concentration of 20% by mass at an amount shown in Table 1 to 50 g of the powder mixture, water was added so that the amount of silica sol and water was 20% by mass and mixed for 30 minutes using a compact-size stirring mixer to produce a slurry.

TABLE 1

| Type | Diamond Powder (% by volume) | | | | | | Amount of Silica Sol (% by mass) |
|---|---|---|---|---|---|---|---|
| | A | B | C | D | E | F | |
| Example 1 | 70 | 0 | 0 | 0 | 30 | 0 | 2.0 |
| Example 2 | 50 | 0 | 20 | 0 | 30 | 0 | 2.0 |
| Example 3 | 40 | 30 | 0 | 0 | 10 | 0 | 2.0 |
| Example 4 | 60 | 0 | 0 | 0 | 40 | 0 | 2.0 |
| Example 5 | 70 | 0 | 0 | 30 | 0 | 0 | 2.0 |
| Example 6 | 0 | 70 | 0 | 0 | 30 | 0 | 2.0 |
| Example 7 | 70 | 0 | 0 | 0 | 30 | 0 | 0.5 |
| Example 8 | 70 | 0 | 0 | 0 | 30 | 0 | 3.0 |
| Example 9 | 70 | 0 | 0 | 0 | 30 | 0 | 2.0 |
| Example 10 | 70 | 0 | 0 | 0 | 30 | 0 | 2.0 |
| Example 11 | 70 | 0 | 0 | 0 | 30 | 0 | 2.0 |
| Comparative Example 1 | 55 | 0 | 0 | 0 | 35 | 10 | 2.0 |
| Comparative Example 2 | 0 | 30 | 30 | 0 | 30 | 10 | 2.0 |
| Comparative Example 3 | 95 | 0 | 0 | 0 | 5 | 0 | 2.0 |
| Comparative Example 4 | 70 | 0 | 0 | 0 | 30 | 0 | 6.0 |
| Comparative Example 5 | 70 | 0 | 0 | 0 | 30 | 0 | 2.0 |
| Comparative Example 6 | 70 | 0 | 0 | 0 | 30 | 0 | 2.0 |

The slurry was then press formed at a pressure of 10 MPa into a plate shape having dimensions of 50 mm×50 mm×10 mm. The resulting compact was dried at a temperature of 120° C. for 2 hours.

Next, the dried product was fired for 1 hour at a firing temperature and firing atmosphere shown in Table 2 to produce a porous diamond preform (preform). The density of the resulting preform was measured by Archimedes' Principle and the content of the diamond grains was calculated in consideration of the added silica portion. The results are shown in Table 2.

After cutting the resulting preform into a shape of 50 mm×50 mm×2.5 mm by a diamond cutter, the thickness was worked to 50 mm×50 mm×1.95 mm by a surface grinder. Ease of handling was evaluated based on conditions such as chipping during working and handling

TABLE 2

| Type | Firing Atmosphere | Firing Temperature (° C.) | Ease of Handling | Content of Diamond Grains (% by volume) |
|---|---|---|---|---|
| Example 1 | air | 900 | Good | 65 |
| Example 2 | air | 900 | Good | 70 |
| Example 3 | air | 900 | Good | 63 |
| Example 4 | air | 900 | Good | 63 |
| Example 5 | air | 900 | Good | 65 |
| Example 6 | air | 900 | Good | 65 |
| Example 7 | air | 900 | Good | 66 |
| Example 8 | air | 900 | Good | 64 |
| Example 9 | nitrogen atmosphere | 900 | Good | 65 |
| Example 10 | air | 800 | Good | 65 |
| Example 11 | air | 1100 | Good | 65 |
| Comparative Example 1 | air | 900 | Good | 72 |
| Comparative Example 2 | air | 900 | Good | 73 |
| Comparative Example 3 | air | 900 | Poor shape retention | — |
| Comparative Example 4 | air | 900 | Good | 62 |
| Comparative Example 5 | air | 600 | Poor shape retention | — |
| Comparative Example 6 | air | 1300 | Poor shape retention | — |

The worked preform (50 mm×50 mm×1.95 mm) was placed in an iron frame with a plate thickness of 2.0 mm, inner dimensions of 50.2 mm×50.2 mm and outer dimensions of 80 mm×80 mm (reference number 1 in FIG. 1 or FIG. 2) coated with a graphite mold release agent, then coated with alumina-sol, baked for 30 minutes at a temperature of 350° C., and stacked such that it is sandwiched from both surfaces by stainless steel plates (SUS430 material, reference number 2 in FIG. 1) of 80 mm×80 mm×1 mm whose surfaces were coated with a graphite mold release agent. Multiple such structures were stacked, 12 mm thick iron plates were placed on both sides, connected by six M10 bolts and clamped using torque wrenches with a clamping torque of 10 Nm in the planar direction to form a block.

Next, after the resulting block was pre-heated to a temperature of 650° C. in an electric furnace, it was placed inside a pre-heated press mold with an inner diameter of 300 mm, into which a molten aluminum alloy containing 12% silicon and 1% magnesium at a temperature of 800° C. was poured, and a pressure of 100 Mpa was applied for 20 minutes to impregnate the preform with the aluminum alloy. After cooling it to room temperature, it was cut along the shape of the stainless steel plates using a wet band saw and after stripping the holding stainless steel plates, anneal was performed for 3 hours at 530° C. to remove strain during impregnation to obtain an aluminum-diamond composite material.

Both surfaces of the resulting aluminum-diamond composite material were ground with a piece of #600 polishing paper, and then buffed.

Subsequently, it was worked into a shape of 25 mm×25 mm×2 mm by a water jet machine (Abrasive Jet Cutter NC manufactured by Sugino Machine Limited), using garnets with a granularity of 100 μm as the abrasive grains under conditions of a pressure of 250 MPa and a working speed of 50 mm/min.

The cross section of the resulting worked product was examined using a factory microscope and the average thickness of the surface layers (reference number 5 in FIG. 3) on both surfaces were measured. Additionally, the surface roughness (Ra) was measured by a surface roughness meter and the planarity was measured by measured by a 3D profile measurer. The results are shown in Table 3. Further, the density measurement of the aluminum-diamond composite of Example 1 by Archimedes' Principle yielded a result of 3.08 g/cm$^3$.

Additionally, specimens for measuring the coefficient of thermal expansion (3 mm×2 mm×10 mm), specimens for measuring thermal conductivity (25 mm×25 mm×2 mm) and specimens for measuring 3-point bending strength (4 mm×2 mm×40 mm) were prepared by water jet cutting. The specimens were respectively used for the measurements of coefficient of thermal expansion at a temperature of 25° C. to 150° C. using a thermal expansion meter (manufactured by Seiko Instruments, Inc.; TMA300), thermal conductivity at a temperature of 25° C. by a laser flash method (manufactured by Rigaku Corporation; LF/TCM-8510B) and 3-point bending strength at a temperature of 25° C. using a bending strength tester. The results are shown in Table 3.

formed into the desired shape. This appears to be due to the fact that the firing temperature was not within the range of 800° C. to 1100° C.

Additionally, as shown in Table 3, while preforms could be obtained for Comparative Examples 1, 2 and 4, their thermal conductivity was at most 300 W/mK. For Comparative Example 1, this appears to be due to the fact that the content of diamond grains having a grain size of at most 15 μm was higher than 40% by volume. Additionally, for Comparative Example 2, this appears to be due to the fact that the content of diamond grains having a grain size of at most 50 μm was lower than 50% by volume. Additionally, for Comparative Example 4, this appears to be due to the fact that the silica sol content was higher than 3% by volume.

In contrast, the aluminum-diamond composites according to Examples 1 to 11 had a surface roughness of 0.25 to 0.29 μm and a planarity of 1 to 3 μm and were therefore very smooth, as well as having a high thermal conductivity and coefficients of thermal expansion close to that of semiconductor devices.

Example 12

An anti-settling agent (manufactured by BYK Chemie Japan: BYK) at 1% by mass and water at 5% by mass were added to the diamond slurry of Example 1, poured into a gypsum mold with inner dimensions of 50 mm×50 mm×20 mm, demolded and dried for 2 hours at a temperature of 120° C. This dried product was fired for 1 hour at a temperature of 900° C. in air to produce a porous diamond preform (preform). The density of the resulting preform was measured by Archimedes' Principle and the content of diamond grains in the preform in consideration of the added silica portion was

TABLE 3

| Type | Average Thickness of Surface Layer (mm) | Surface roughness Ra (μm) | Planarity (μm) | Thermal Conductivity (W/mK) | Coefficient of Thermal Expansion (×10$^{-6}$/K) | Bending Strength (MPa) |
|---|---|---|---|---|---|---|
| Example 1 | 0.07 | 0.27 | 1 | 470 | 6.9 | 330 |
| Example 2 | 0.07 | 0.26 | 2 | 520 | 6.2 | 350 |
| Example 3 | 0.06 | 0.26 | 1 | 490 | 7.1 | 320 |
| Example 4 | 0.08 | 0.25 | 2 | 450 | 7.0 | 330 |
| Example 5 | 0.07 | 0.29 | 2 | 480 | 6.9 | 320 |
| Example 6 | 0.07 | 0.28 | 1 | 440 | 6.8 | 350 |
| Example 7 | 0.08 | 0.29 | 2 | 480 | 6.9 | 310 |
| Example 8 | 0.07 | 0.28 | 3 | 460 | 6.8 | 340 |
| Example 9 | 0.07 | 0.28 | 1 | 480 | 6.9 | 320 |
| Example 10 | 0.08 | 0.26 | 2 | 480 | 7.0 | 310 |
| Example 11 | 0.06 | 0.29 | 3 | 460 | 6.8 | 340 |
| Comparative Example 1 | 0.08 | 0.28 | 2 | 300 | 5.9 | 360 |
| Comparative Example 2 | 0.07 | 0.29 | 1 | 290 | 5.7 | 370 |
| Comparative Example 4 | 0.07 | 0.27 | 2 | 280 | 6.8 | 340 |

Next, after the worked product was subjected to ultrasonic cleaning, non-electrolytic Ni—P and Ni—B plating were performed to form an 8 μm thick plating layer (Ni—P: 6 μm+Ni—B: 2 μm) on the surface of the composite material. The solder flux of the resulting plated products was measured in accordance with JIS Z3197 (the corresponding international standard is ISO 9455) and all of the plated products had a solder flux of at least 80%.

As shown in Tables 1 and 2, a sufficient strength could not be obtained for Comparative Example 3, so the preform could not be formed into the desired shape. This appears to be due to the fact that the content of diamond grains having a grain size of at most 15 μm was lower than 10% by volume. Additionally, a sufficient strength could not be obtained for Comparative Examples 5 and 6, so the preforms could not be calculated to be 64% by volume. After cutting the resulting preform into a shape of 50 mm×50 mm×2.5 mm by a diamond cutter, the thickness was worked to 50 mm×50 mm×1.95 mm by a surface grinder. Chipping or the like did not occur during working and handling, so the ease of handling was good.

The worked preform (50 mm×50 mm×1.95 mm) was used to produce an aluminum-diamond composite in the same manner as Example 1. The resulting aluminum-diamond composite was evaluated for the same properties as Example 1 was. The density of the resulting aluminum-diamond composite was 3.07 g/cm$^3$, the coefficient of thermal expansion at temperatures of 25° C. to 150° C. was 7.2×10$^{-6}$/K, the thermal conductivity at a temperature of 25° C. was 460 W/mK and the 3-point bending strength was 320 MPa. Further, the resulting aluminum-diamond composite was ground and worked similarly to Example 1 to a shape of 25 mm×25 mm×2 mm, the cross section of the worked product was examined using a factory microscope, the average thickness of the surface layers (reference number 5 in FIG. 3) on both surfaces was measured and the average thickness of surface layers 5 was 0.07 mm. Additionally, the surface roughness (Ra) measured by a surface roughness meter was 0.27 µm and the planarity measured by a 3D profile measurer was 2 µm.

The aluminum-diamond composite according to Example 12 had a surface roughness of 0.27 µm and a planarity of 2 µm and was therefore very smooth, as well as having a high thermal conductivity and a coefficient of thermal expansion close to that of semiconductor devices.

Examples 13 to 21 and Comparative Examples 7 to 9

The preform of Example 1, after its thickness was worked (50 mm×50 mm×1.95 mm, reference number 3 in FIG. 1 or FIG. 2), was placed in an iron frame with a plate thickness of 2.0 mm, inner dimensions of 50.2 mm×50.2 mm and outer dimensions of 80 mm×80 mm (reference number 1 in FIG. 1 or FIG. 2) coated with a graphite mold release agent, coated with alumina-sol, baked for 30 minutes at a temperature of 350° C., then stacked so as to be sandwiched from both surfaces by stainless steel plates (SUS430 material, reference number 2 in FIG. 1) of 80 mm×80 mm×1 mm whose surfaces were coated with a graphite mold release agent.

Multiple such structures were stacked, 12 mm thick iron plates were placed on both sides, connected by six M10 bolts and clamped using torque wrenches with a clamping torque of 10 Nm in the planar direction to form a block. Additionally, an isotropic graphite material (manufactured by Toyo Tanso Co., Ltd.: IG11) with a plate thickness of 2.0 mm, inner dimensions of 50.2 mm×50.2 mm and outer dimensions of 80 mm×80 mm coated with a graphite mold release agent was used as the frame.

Next, after the resulting block was pre-heated at a temperature shown in Table 4 in an electric furnace, it was placed inside a pre-heated press mold with an inner diameter of 300 mm, into which a molten aluminum alloy of a composition shown in Table 4 at a temperature of 800° C. was poured, and a pressure shown in Table 4 was applied for 20 minutes to impregnate the preform with the aluminum alloy. After cooling it to room temperature, it was cut along the shape of the stainless steel plates using a wet band saw and after stripping the holding stainless steel plates, an anneal was performed for 3 hours at 530° C. to remove strain during impregnation to obtain an aluminum-diamond composite material.

Here, for Comparative Examples 7 and 8, the diamond powders were not impregnated with the aluminum alloys, so aluminum-diamond composites could not be obtained. For Comparative Example 7, this appears to be due to that fact that the preheating temperature was at most 600° C. Additionally, for Comparative Example 8, this appears to be due to the fact that the pressure during impregnation was at most 20 MPa.

TABLE 4

| Type | Aluminum Alloy Composition (% by mass) | | | Preheat Temperature (° C.) | Impregnation Pressure (MPa) |
|---|---|---|---|---|---|
| | Al | Si | Mg | | |
| Example 13 | 87.0 | 12.0 | 1.0 | 600 | 100 |
| Example 14 | 87.0 | 12.0 | 1.0 | 750 | 100 |
| Example 15 | 87.0 | 12.0 | 1.0 | 650 | 20 |
| Example 16 | 87.0 | 12.0 | 1.0 | 650 | 150 |
| Example 17 | 98.0 | 0 | 2.0 | 700 | 100 |
| Example 18 | 87.5 | 12.0 | 0.5 | 650 | 100 |
| Example 19 | 85.0 | 12.0 | 3.0 | 650 | 100 |
| Example 20 | 74.0 | 25.0 | 1.0 | 650 | 100 |
| Example 21 | 87.0 | 12.0 | 1.0 | 650 | 100 |
| Comparative Example 7 | 87.0 | 12.0 | 1.0 | 500 | 100 |
| Comparative Example 8 | 87.0 | 12.0 | 1.0 | 600 | 5 |
| Comparative Example 9 | 100 | 0 | 0 | 600 | 20 |

Both surfaces of the resulting aluminum-diamond composite material were ground with a piece of #600 polishing paper, and then buffed. Then it was worked into a shape of 25 mm×25 mm×2 mm by an electrical discharge machine at a condition of the working speed being 5 mm/min. The cross section of the resulting worked product was examined by a factory microscope and the average thickness of the surface layers (reference number 5 in FIG. 3) on both surfaces was measured. Additionally, the surface roughness (Ra) was measured by a surface roughness meter and the planarity was measured by a 3D profile measurer. The results are shown in Table 5.

Additionally, specimens for measuring the coefficient of thermal expansion (3 mm×2 mm×10 mm), specimens for measuring thermal conductivity (25 mm×25 mm×2 mm) and specimens for measuring 3-point bending strength (4 mm×2 mm×40 mm) were prepared by electrical discharge cutting. The specimens were respectively used in the same manner as Example 1 for the measurement of coefficient of thermal expansion at a temperature of 25° C. to 150° C., thermal conductivity at a temperature of 25° C. and 3-point bending strength at a temperature of 25° C. The results are shown in Table 5.

TABLE 5

| Type | Average Thickness of Surface Layer (mm) | Surface Roughness Ra (µm) | Planarity (µm) | Thermal Conductivity (W/mK) | Coefficient of Thermal Expansion (×10$^{-6}$/K) | Bending Strength (MPa) |
|---|---|---|---|---|---|---|
| Example 13 | 0.07 | 0.28 | 1 | 460 | 6.9 | 320 |
| Example 14 | 0.07 | 0.27 | 2 | 460 | 7.0 | 340 |
| Example 15 | 0.08 | 0.29 | 1 | 450 | 6.9 | 320 |
| Example 16 | 0.07 | 0.28 | 1 | 480 | 6.9 | 330 |
| Example 17 | 0.08 | 0.35 | 2 | 500 | 7.5 | 300 |
| Example 18 | 0.08 | 0.29 | 1 | 430 | 6.9 | 320 |
| Example 19 | 0.08 | 0.31 | 2 | 480 | 7.0 | 310 |
| Example 20 | 0.08 | 0.42 | 3 | 440 | 6.6 | 290 |
| Example 21 | 0.07 | 0.28 | 1 | 470 | 6.9 | 330 |
| Comparative Example 9 | 0.09 | 0.45 | 5 | 250 | 7.6 | 230 |

As can be seen from Table 5, Comparative Example 9 has a large planarity of 5 μm and a low thermal conductivity of 250 W/mK. This appears to be due to the fact that a strong bond between the diamond grains and metal portion could not be obtained, as Mg was not added.

Examples 22 to 29

The preform of Example 1, after its thickness was worked (50 mm×50 mm×1.95 mm, reference number 3 in FIG. 6), was placed in an iron frame with a plate thickness shown in Table 6, inner dimensions of 50.2 mm×50.2 mm and outer dimensions of 80 mm×80 mm (reference number 1 in FIG. 6) coated with a graphite mold release agent, sandwiched from both surfaces by pieces of ceramic paper (reference number 10 in FIG. 6) shown in Table 6, further coated with alumina-sol, and baked for 30 minutes at a temperature of 350° C., then stacked so as to be sandwiched from both surfaces by stainless steel plates (SUS430 material, reference number 2 in FIG. 6) of 80 mm×80 mm×1 mm whose surfaces were coated with a graphite mold release agent.

Multiple such structures were stacked, 12 mm thick iron plates were placed on both sides, connected by six M10 bolts and clamped using torque wrenches with a clamping torque of 10 Nm in the planar direction to form a block. At this stage, the ceramic paper was compressed and the total thickness of the structure was the thickness of the frame.

Next, the resulting block was worked in the same manner as Example 1, allowing the diamond powder to be impregnated with the aluminum alloy, to produce an aluminum-diamond composite of 40 mm×40 mm×frame thickness. The content of diamond grains in the resulting aluminum-diamond composite and the ceramic content (Vf) of the aluminum-ceramic composite material on the surface of the aluminum-diamond composite are shown in Table 6.

TABLE 6

| Type | Frame Thickness (mm) | Type of Ceramic | Ceramic Paper Vf (% by volume) | Thickness (mm) | Content of Diamond Grains (% by volume) | Vf of Surface Layers (% by volume) |
| --- | --- | --- | --- | --- | --- | --- |
| Example 22 | 2.2 | Alumina | 5 | 0.2 | 59 | 10 |
| Example 23 | 2.4 | Alumina | 5 | 0.4 | 54 | 10 |
| Example 24 | 2.4 | Alumina | 10 | 0.4 | 54 | 20 |
| Example 25 | 2.4 | Alumina | 10 | 0.6 | 54 | 30 |
| Example 26 | 3.0 | Alumina | 5 | 1.0 | 43 | 10 |
| Example 27 | 2.4 | Alumina | 5 | 0.4 | 54 | 10 |
| Example 28 | 2.4 | Mullite | 5 | 0.4 | 54 | 10 |
| Example 29 | 2.4 | Silica | 5 | 0.4 | 54 | 10 |

Note 1:
The thickness of the ceramic paper is the thickness on one side.

The resulting aluminum-diamond composite was ground in the same manner as Example 1, then worked to a shape of 25 mm×25 mm×2.4 mm by a water jet machine. Additionally, for Example 28, the surface layers on both surfaces were each ground to 0.15 mm by a surface grinder, then buffed. The resulting Example 28 had a shape of 25 mm×25 mm×2.1 mm and the content of diamond grains was 62% by volume.

Moreover, the cross section of the worked product was examined using a factory microscope and the average thickness of the surface layers (surface layers 7 consisting of an aluminum-ceramic composite material) on both surfaces was measured. Additionally, the surface roughness (Ra) was measured by a surface roughness meter and the planarity was measured by a 3D profile measurer. The results are shown in Table 7.

Further, specimens for measuring the coefficient of thermal expansion (3 mm×10 mm×plate thickness), specimens for measuring thermal conductivity (25 mm×25 mm×plate thickness) and specimens for measuring 3-point bending strength (4 mm×40 mm×plate thickness) were prepared by water jet cutting. The specimens were respectively used in the same manner as Example 1 for the measurements of coefficient of thermal expansion at a temperature of 25° C. to 150° C., thermal conductivity at a temperature of 25° C. and 3-point bending strength at a temperature of 25° C. The results are shown in Table 7.

TABLE 7

| Type | Average Thickness of Surface Layer (mm) | Surface Roughness Ra (μm) | Planarity (μm) | Thermal Conductivity (W/mK) | Coefficient of Thermal Expansion (×10⁻⁶/K) | Bending Strength (MPa) |
|---|---|---|---|---|---|---|
| Example 22 | 0.13 | 0.33 | 2 | 430 | 7.8 | 320 |
| Example 23 | 0.23 | 0.31 | 2 | 400 | 8.5 | 300 |
| Example 24 | 0.24 | 0.33 | 1 | 390 | 8.4 | 310 |
| Example 25 | 0.24 | 0.36 | 1 | 390 | 8.3 | 310 |
| Example 26 | 0.53 | 0.35 | 3 | 350 | 9.8 | 250 |
| Example 27 | 0.10 | 0.31 | 1 | 450 | 7.6 | 330 |
| Example 28 | 0.24 | 0.31 | 2 | 390 | 8.6 | 310 |
| Example 29 | 0.23 | 0.32 | 1 | 390 | 8.4 | 290 |

Next, after the worked product was subjected to ultrasonic cleaning, non-electrolytic Ni—P and non-electrolytic Au plating were performed to form a 6.1 μm thick plating layer (Ni—P: 6 μm+Au: 0.1 μm) on the surface of the composite material. The solder flux of the resulting plated products was measured in accordance with JIS Z3197 and all of the plated products of Examples 22 to 29 had a solder flux of at least 85%.

As shown in Table 7, the aluminum-diamond composites of Examples 23 to 30 had a surface roughness of 0.31 to 0.36 μm and a planarity of 1 to 3 μm and were therefore very smooth, as well as having a high thermal conductivity and coefficients of thermal expansion close to that of semiconductor devices.

Additionally, it is clear that the average thickness of the surface layers (surface layers 7 consisting of an aluminum-ceramic composite material) (Table 7) corresponds to the thickness of ceramic paper 10 (Table 6). In other words, it is clear that the provision of ceramic paper 10 during compositing allows surfaces layers (surface layers 7 consisting of an aluminum-ceramic composite material) of a desired thickness to form.

The invention claimed is:

1. A process for producing an aluminum-diamond composite, comprising:
    (a) preparing a diamond powder comprising diamond grains having a grain size of at least 50 μm at 50% or more by volume of all diamond grains and diamond grains having a grain size of at most 15 μm at 10 to 40% by volume of all diamond grains;
    (b) adding to said diamond powder a colloidal silica at 0.5 to 3% by mass in terms of solid content with respect to all diamond grains to obtain a slurry;
    (c) press forming or slip casting said slurry to produce a compact of said diamond grains;
    (d) firing said compact at 800° C. to 1100° C. in air or in a nitrogen atmosphere to obtain a porous diamond preform wherein the content of the diamond grains is 40 to 70% by volume of the total volume;
    (e) heating said porous diamond preform;
    (f) heating an aluminum alloy to a temperature equal to or above the melting point of the alloy and impregnating said porous diamond preform with the alloy to produce a plate-shaped aluminum-diamond composite wherein both surfaces are covered by a surface layer comprising a metal mainly composed of aluminum; and
    (g) working said aluminum-diamond composite into an aluminum-diamond composite.

2. A process for producing an aluminum-diamond composite according to claim 1, wherein
    during said heating said porous diamond preform, said porous diamond preform is placed in an iron or graphite frame, with said porous diamond preform being sandwiched from both surfaces by mold release plates coated with a mold release agent, and heated at 600 to 750° C.

3. A process for producing an aluminum-diamond composite according to claim 2, wherein said heating said porous diamond preform, a piece of ceramic paper with a thickness of 0.05 to 0.5 mm is provided on both surfaces of said porous diamond preform and said porous diamond preform is further sandwiched by said mold release plates.

4. A process for producing an aluminum-diamond composite according to claim 1, further comprising processing said porous diamond preform before said heating said porous diamond preform.

5. A process for producing an aluminum-diamond composite according to claim 1, wherein during said working said aluminum-diamond composite, said aluminum-diamond composite is worked into an aluminum-diamond composite by water jet cutting or electrical discharge cutting.

6. A process for producing an aluminum-diamond composite according to claim 5, wherein a side surface portion and a hole portion are formed during said water jet cutting or electrical discharge cutting.

7. A process for producing an aluminum-diamond composite according to claim 1, wherein during said producing a plate-shaped aluminum-diamond composite, an aluminum alloy comprising silicon at 0 to 25% by mass and magnesium at 0.5 to 3% by mass is heated to a temperature equal to or above the melting point of the alloy and said porous diamond preform is impregnated with the alloy at a pressure of at least 20 MPa to produce a plate-shaped aluminum-diamond composite wherein both surfaces are covered by a surface layer comprising a metal mainly composed of aluminum.

* * * * *